(12) United States Patent
Thakur et al.

(10) Patent No.: US 8,378,725 B2
(45) Date of Patent: Feb. 19, 2013

(54) ADAPTIVE BANDWIDTH PHASE-LOCKED LOOP

(75) Inventors: Krishna Thakur, Noida (IN);
Deependra K. Jain, Jabalpur (IN);
Vinod K. Jain, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 212 days.

(21) Appl. No.: 13/046,789

(22) Filed: Mar. 14, 2011

(65) Prior Publication Data
US 2012/0235718 A1 Sep. 20, 2012

(51) Int. Cl.
*H03L 7/06* (2006.01)

(52) U.S. Cl. ........................................... 327/157

(58) Field of Classification Search .................. None
See application file for complete search history.

(56) References Cited

U.S. PATENT DOCUMENTS

| | | | |
|---|---|---|---|
| 5,491,439 A * | 2/1996 | Kelkar et al. ................. | 327/157 |
| 5,508,660 A | 4/1996 | Gersbach et al. | |
| 6,828,864 B2 | 12/2004 | Maxim | |
| 6,894,569 B2 | 5/2005 | Fayneh et al. | |
| 7,009,456 B2 * | 3/2006 | Jasa et al. ....................... | 331/16 |
| 7,173,461 B2 | 2/2007 | Tan | |
| 7,176,733 B2 | 2/2007 | Haerle | |
| 7,365,581 B2 | 4/2008 | Shi | |
| 7,847,607 B2 * | 12/2010 | Okada ............................ | 327/156 |
| 8,040,191 B2 * | 10/2011 | Hirai ................................ | 331/16 |
| 8,289,057 B2 * | 10/2012 | Kawamoto ..................... | 327/157 |

OTHER PUBLICATIONS

Stefanos Sidiropoulos, Dean Liu, Jaeha Kim, Guyeon Wei, and Mark Horowitz, Adaptive Bandwidth DLLs and PLLs using Regulated Supply CMOS Buffers, Rambus Inc and Stanford University, Symposium VLSI Circuits Digest of Technical Papers, 2000.
J. Maneatis, "Low-Jitter Process-Independent DLL and PLL based on self-biased techniques,"IEEE J. Solid-State Circuits, vol. 31, pp. 1723-1732, Nov. 1996.

* cited by examiner

*Primary Examiner* — Lincoln Donovan
*Assistant Examiner* — Khareem E Almo
(74) *Attorney, Agent, or Firm* — Charles Bergere

(57) ABSTRACT

A phase-locked loop (PLL) generates an oscillator signal based on an input reference signal. A voltage-to-current converter converts a control voltage to a first current. A current-controlled oscillator generates the oscillator signal based on the first current. A dual charge pump circuit generates first and second charge pump currents having a predetermined ratio, based on a second current generated by a current mirror circuit and an error (feedback) signal. An active loop filter generates the control voltage based on the first and second charge pump currents. The active loop filter includes an input capacitance that varies with a variation in the predetermined ratio of the charge pump currents. The active loop filter also includes a transconductance stage having a transconductance that varies based on a third current generated by a current mirror circuit. The PLL bandwidth is independent of PVT variations and dependent only on the frequency of the input reference signal. In addition, the size of the input capacitor is relatively small so that the circuit requires very little space.

16 Claims, 3 Drawing Sheets

ADAPTIVE BANDWIDTH PHASE-LOCKED LOOP

BACKGROUND OF THE INVENTION

The present invention relates generally to a system for generating an oscillator signal and, more particularly, to a phase-locked loop (PLL) for generating an oscillator signal.

A phase-locked loop (PLL) is a control system that generates an oscillator signal having a constant phase relationship with an input reference signal. PLLs are widely used in various applications such as radios, telecommunications, computers, and other electronic applications. A PLL includes a voltage-controlled oscillator (VCO) for generating the oscillator signal based on a control voltage, and a phase detector for comparing the phase of the oscillator signal with that of the input reference signal and for generating an error signal based on the detected phase difference. The PLL also includes a loop filter for filtering the error signal and generating the control voltage used by the VCO.

For stable operation, the bandwidth of the PLL is required to be dependent only on the frequency of the input reference signal. However, the bandwidth may vary with various other parameters, such as process, voltage and temperature (PVT) variations, loop division factor 'N', PLL design parameters and the like. These parameters introduce undesired variance into the PLL bandwidth and degrade the loop stability of the PLL. Further, the input capacitance of the loop filter is known to consume a substantial portion of the overall circuit area.

It would be advantageous to have a PLL whose bandwidth is independent of PVT variations, loop division factor, and PLL design parameters, and dependent only on the frequency of the input reference signal. It would be further advantageous to reduce the area consumed by the input capacitor used in the PLL loop filter.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
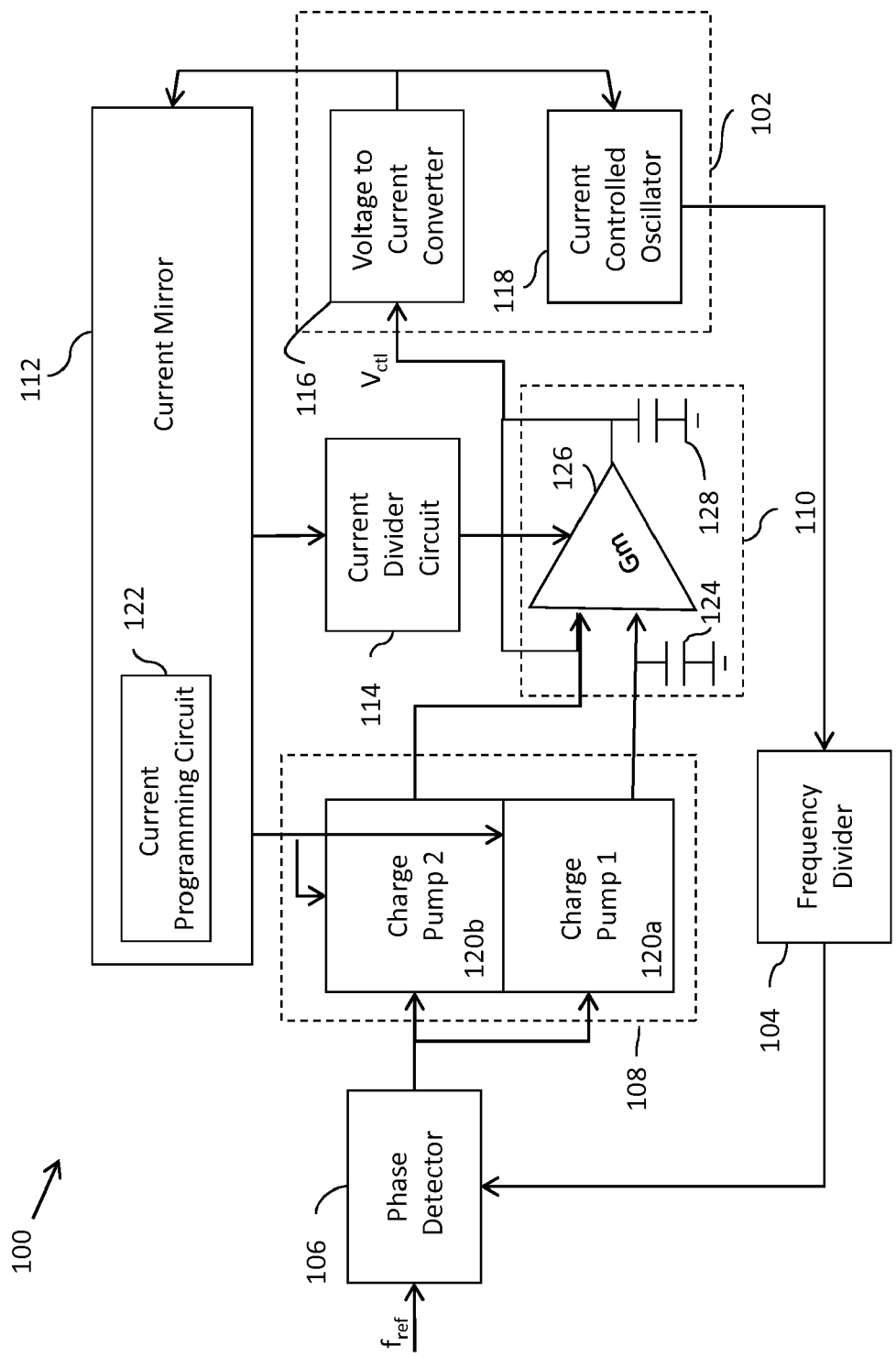
FIG. 1 is a schematic block diagram illustrating a phase-locked loop (PLL) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a phase-locked loop (PLL) is provided. The PLL includes a voltage-controlled oscillator (VCO), which includes a voltage-to-current converter and a current-controlled oscillator (CCO). The voltage-to-current converter converts a control voltage to a first current. The CCO is connected to the voltage-to-current converter and generates an oscillator signal based on the first current. A phase detector is connected to the VCO for generating an error signal based on an input reference signal and a fraction of the oscillator signal. A current mirror circuit is connected to the voltage-to-current converter. The current mirror circuit generates a second current based on a fraction of the first current. A dual charge pump circuit is connected between the phase detector and the voltage-to-current converter. The dual charge pump circuit receives the error signal and the second current, and generates a first and second charge pump currents according to a predetermined ratio. An active loop filter is connected to the dual charge pump circuit, the current mirror circuit and the voltage-to-current converter. The active loop filter generates the control voltage based on the first and second charge pump currents. The active loop filter includes an input capacitance that varies with a variation in the predetermined ratio of the first and second charge pump currents. The active loop filter also includes a transconductance stage having a transconductance that varies based on a third current generated by the current mirror circuit. The input transistors of the transconductance stage operate in a sub-threshold region.

In another embodiment of the present invention, a system for generating an oscillator signal is provided. The system includes a voltage-to-current converter and a CCO. The voltage-to-current converter converts a control voltage to a first current. The CCO is connected to the voltage-to-current converter and generates an oscillator signal based on the first current. A phase detector is connected to the VCO for generating an error signal based on an input reference signal and a fraction of the oscillator signal. A current mirror circuit is connected to the voltage-to-current converter. The current mirror circuit generates a second current based on a fraction of the first current. A dual charge pump circuit is connected between the phase detector and the voltage-to-current converter. The dual charge pump circuit receives the error signal and the second current, and generates first and second charge pump currents according to a predetermined ratio. An active loop filter is connected to the dual charge pump circuit, the current mirror circuit and the voltage-to-current converter. The active loop filter generates the control voltage based on the first and second charge pump currents. The active loop filter includes an input capacitance that varies with variation in the predetermined ratio of the first and second charge pump currents. The active loop filter also includes a transconductance stage having a transconductance that varies based on a third current generated by the current mirror circuit. The input transistors of the transconductance stage operate in a sub-threshold region.

Embodiments of the present invention provide a phase-locked loop (PLL) for generating an oscillator signal. The bandwidth of the PLL is made proportional to a predetermined ratio between first and second charge pump currents. The predetermined ratio is preferably directly proportional to the frequency of the input reference signal. Thus, the bandwidth of the PLL is directly proportional to the frequency of the input reference signal and does not vary with PVT variations, design parameters and loop division factor, thereby making the PLL system very stable. The input capacitance of the active loop filter varies with variation in the predetermined ratio of the first and second charge pump currents. Hence, the value of the input capacitance can be kept low, thereby reducing the circuit area of the PLL. The active loop filter also includes a transconductance stage having a transconductance that varies based on a third current generated by the current mirror circuit. This provides for a programmable low pass filter.

Referring now to FIG. 1, a schematic block diagram of a phase-locked loop (PLL) 100 in accordance with an embodiment of the present invention is shown. The PLL 100 includes a voltage-controlled oscillator (VCO) 102, a frequency divider 104, a phase detector 106, a dual charge pump circuit 108, an active loop filter 110, a current mirror circuit 112, and a current divider circuit 114. The VCO 102 includes a voltage-to-current converter 116 and a current-controlled oscillator (CCO) 118. The voltage-to-current converter 116 converts a control voltage ($V_{ctl}$) to a first current. The CCO 118, which is connected to the voltage-to-current converter 116, generates an oscillator signal based on the first current. The frequency divider 104 is connected between the CCO 118 and the phase detector 106 and provides a fraction of the oscillator signal to the phase detector 106. The phase detector 106 is coupled to the VCO 102 by way of the frequency divider 104 and generates an error signal based on an input reference signal ($f_{ref}$) and the fraction of the oscillator signal. The current mirror circuit 112 is connected to the voltage-to-current converter 116 and generates a second current based on a fraction of the first current. The fraction may be derived from experimental PLL stability analysis and is based on classical PLL design equations.

The dual charge pump circuit 108 is connected to the phase detector 106, the voltage-to-current converter 116 and the current mirror circuit 112. The dual charge pump circuit 108 receives the error signal from the phase detector 106 and the second current from the current mirror circuit 112 and generates a first charge pump current ($I_{CP1}$) and a second charge pump current ($I_{CP2}$) according to a predetermined ratio. As shown in the drawing, in one embodiment the dual charge pump circuit 108 includes a first charge pump 120a and a second charge pump 120b for generating the two charge pump currents, $I_{CP1}$ and $I_{CP2}$, respectively.

A current programming circuit 122 is used to program or set the ratio between $I_{CP1}$ and $I_{CP2}$. The capacitance value of the input capacitor 124 varies with the variation in the predetermined ratio between $I_{CP1}$ and $I_{CP2}$. The capacitance value is multiplied by the ratio between $I_{CP1}$ and $I_{CP2}$, which increases the effective capacitance of the input capacitor. Hence, the size of the input capacitor 124 can be kept low, thereby reducing the circuit area of the PLL. For example, in one embodiment of the invention, the input capacitor is on the order of 100 pf. The ratio between $I_{CP1}$ and $I_{CP2}$ may be chosen depending upon the capacitance value required for operating the PLL. In one embodiment of the present invention, the current programming circuit 122 is integrated into (is part of) the current mirror circuit 112, and in another embodiment of the present invention, the current mirror circuit 122 is integrated into the dual charge pump circuit 108.

The active loop filter 110 is connected between the dual charge pump circuit 108, the current mirror circuit 112 and the voltage-to-current converter 116. The active loop filter 110 includes an input capacitor 124, a transconductance stage 126 and an output capacitor 128. The input capacitor 124 is connected between the line that provides the first charge pump current ($I_{CP1}$) to the transconductance stage 126 and ground, and the output capacitor 128 is connected between the line that provides the second charge pump current ($I_{CP2}$) to the transconductance stage 126 and ground.

The current divider circuit 114 is connected between the current mirror circuit 112 and the active loop filter 110 and provides a third current generated by the current mirror circuit 112 to the transconductance stage 126. That is, the current mirror circuit 112 generates a third current that is provided to the current divider circuit 114 and the current divider circuit 114 generates a fraction of the third current and provides this fractional current to the active loop filter 110.

The active loop filter 110 generates the control voltage ($V_{ctl}$) based on the first and second charge pump currents $I_{CP1}$ and $I_{CP2}$. In one embodiment of the invention, the active loop filter 110 is a low pass filter. The capacitance value of the input capacitor 124 may vary with the variation in the predetermined ratio between $I_{CP1}$ and $I_{CP2}$. The capacitance value is multiplied by the ratio between $I_{CP1}$ and $I_{CP2}$ which increases the effective capacitance of the input capacitor. For example, if the ratio ICP1:ICP2 is equal to 1:2 and the capacitance value of the input capacitor 124 is chosen to be 100 picofarad (pf), the effective capacitance of the input capacitor 124 equals 200 pf. Hence, the size of the input capacitor 124 can be kept low, which allows for a PLL with a reduced or small circuit area. The transconductance of the transconductance stage 126 varies with the variation in the third current. As will be discussed below with reference to FIG. 2, in one embodiment of the present invention, input transistors of the transconductance stage 126 operate in a sub-threshold region.

Figure 2:
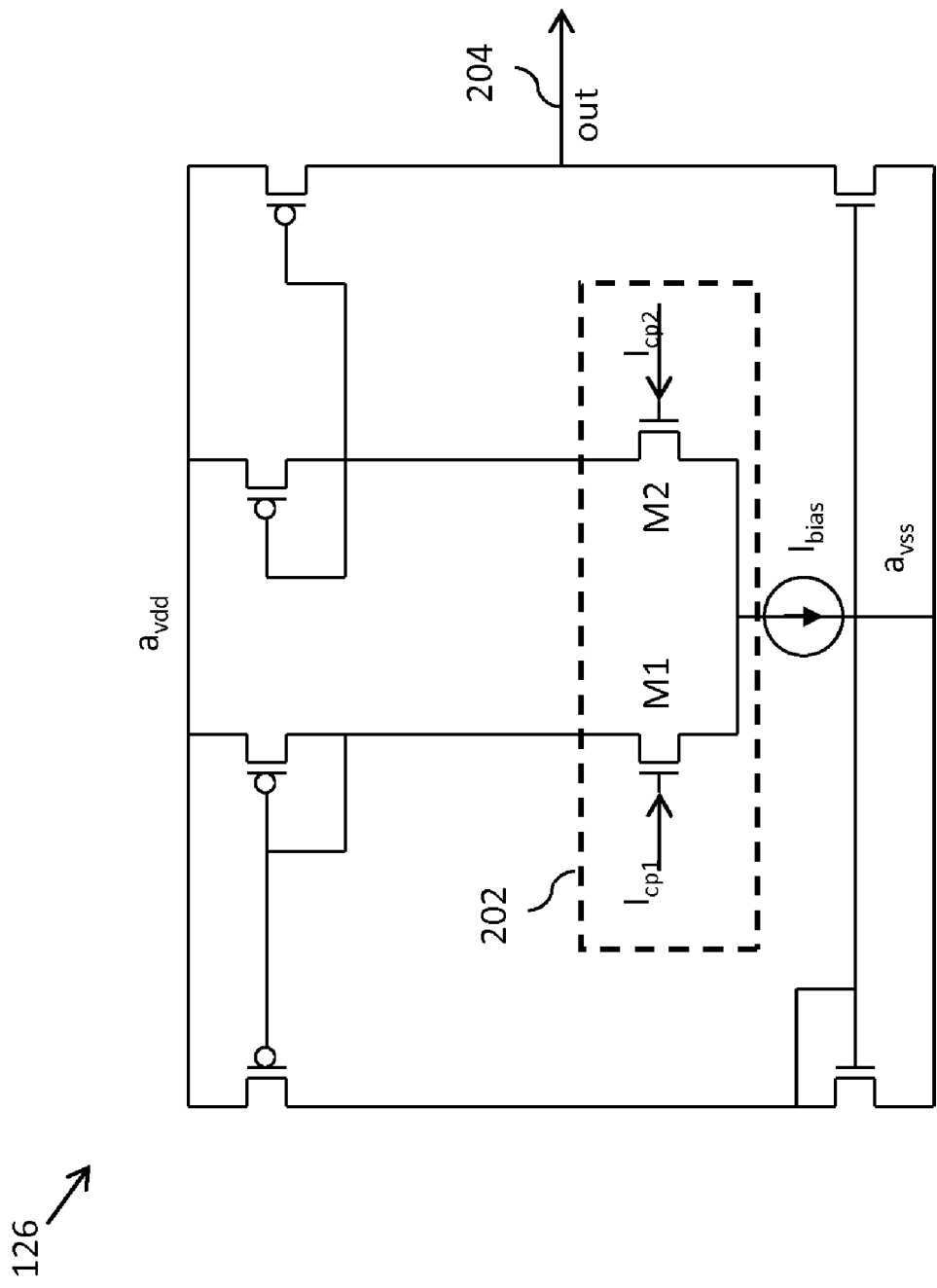
FIG. 2 is a schematic block diagram illustrating a transconductance stage of the PLL of FIG. 1.

Referring now to FIG. 2, a schematic block diagram of the transconductance stage 126 in accordance with an embodiment of the present invention is shown. The transconductance stage 126 may be a conventional transconductance circuit and includes a pair of input transistors 202 and an output stage 204. The charge pump currents $I_{CP1}$ and $I_{CP2}$ are provided at the control terminals of the input transistors 202 as shown, and the output stage 204 is coupled to the output capacitor 128. When the transconductance stage 126 is used in the PLL 100, the pair of input transistors 202 operates in the sub-threshold region, which provides benefits as discussed in more detail below.

In operation, the PLL 100 is closed and the CCO 118 is tuned to the locking frequency. The frequency divider 104 divides the oscillator signal by a loop division factor 'N' and provides a fraction of the oscillator signal to the phase detector 106. The phase detector 106 also receives the input reference signal $f_{ref}$. In an embodiment of the present invention, the frequency of the input reference signal may be '1/N' times the locking frequency. The phase detector 106 compares the phase and frequency of the fraction of the oscillator signal and the input reference signal $f_{ref}$ to generate the error signal. In an embodiment of the present invention, the error signal is in the form of a pulse having up and down transitions that represent the phase/frequency error between the input reference signal $f_{ref}$ and the fraction of the oscillator signal. Thereafter, the error signal is provided to the dual charge pump circuit 108.

The dual charge pump circuit 108 generates the charge pump currents $I_{CP1}$ and $I_{CP2}$ based on the error signal and the second current generated by the current mirror circuit 112. In an embodiment of the present invention, the dual charge pump circuit 108 is responsive to the up and down transitions of the error signal. Based on these up and down transitions, the dual charge pump circuit 108 provides the charge pump currents $I_{CP1}$ and $I_{CP2}$ to the active loop filter 110. The active loop filter 110 receives the charge pump currents $I_{CP1}$ and $I_{CP2}$ and generates an equivalent control voltage ($V_{ctl}$), which is input to the voltage-to-current converter 116.

The effective capacitance value of the input capacitor 124 is varied based on the predetermined ratio of $I_{CP1}$ and $I_{CP2}$. Further, the transconductance of the transconductance stage 126 varies with the third current generated by the current mirror circuit 112. Thus, the active loop filter 110 is configured to act as a programmable low pass filter with a variable input capacitance and a variable transconductance (or resistance).

The predetermined ratio between $I_{CP1}$ and $I_{CP2}$ preferably is directly proportional to the frequency of the input reference signal $f_{ref}$ by calculating experimental values for the predetermined ratio for different sets of input reference signal frequencies.

The bandwidth of the PLL system 100 is given by the following mathematical equation, $$BW \alpha (I_{CP} * K_{VCO} * R * K)/N, \text{ where} \quad (1)$$

BW=bandwidth of the PLL system 100,
$I_{CP} = I_{CP1}$,
R=Loop Resistance
K=predetermined ratio between $I_{CP1}$ and $I_{CP2}$, and
N=Loop Division Factor
Further, $$K_{VCO} = \beta/C_1, \text{ where} \quad (2)$$

$\beta$=process parameter determined by PVT variations and
$C_1$=capacitive load of the VCO $$I_{VCO} \alpha f_{VCO} \alpha (N * f_{ref}), \text{ where} \quad (3)$$

$I_{VCO}$=VCO current (first current),
$f_{VCO}$=frequency of the oscillator signal, and
$f_{ref}$=frequency of the input reference signal $$I_{CP} \alpha I_{VCO} \alpha (N * f_{ref}) \quad (4)$$

Figure 3:
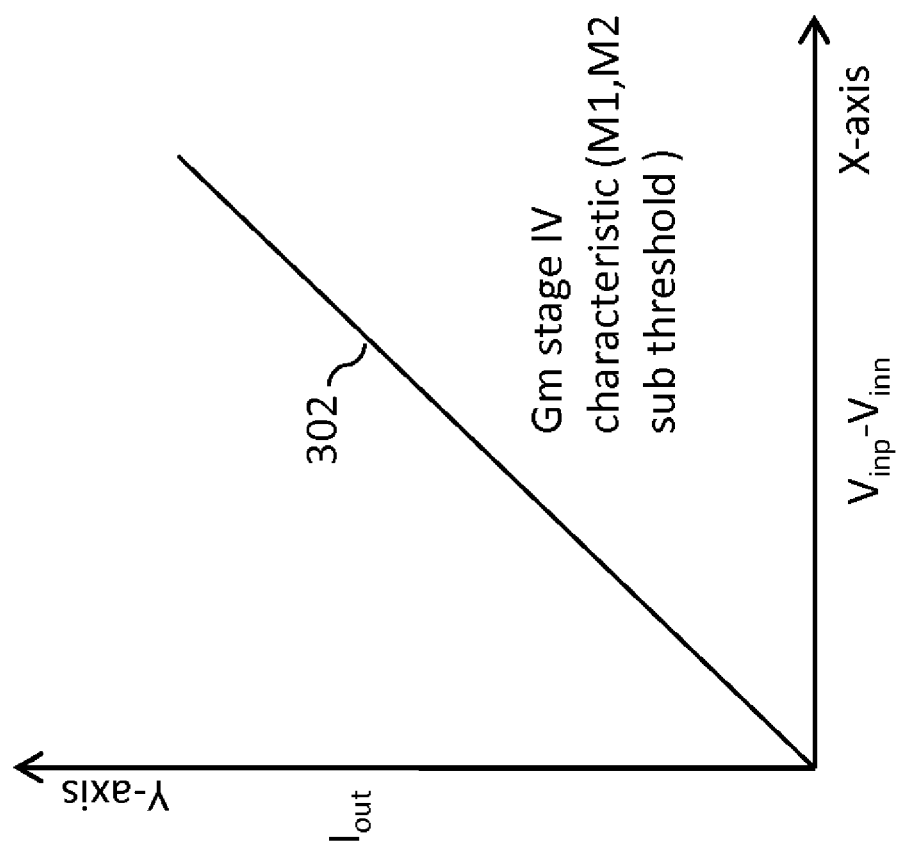
FIG. 3 is a graph illustrating voltage-current (VI) characteristics of input transistors used in the transconductance stage of FIG. 2.

Further, as the input transistors 202 of the transconductance stage 126 are operating in the sub-threshold region, the bias current of the input transistors 202 has a linear relationship with the output voltage, as illustrated in FIG. 3. Hence, the transconductance ($g_m$) is given by, $$g_m \alpha \beta * I_{gm}, \text{ where} \quad (5)$$

$I_{gm}$=bias current of the input transistors
As $I_{gm}$ is a fraction of the VCO current, $$I_{gm} = I_{VCO}/N \quad (6)$$

As $g_m$ is inversely proportional to R, from equations (4), (5) and (6), $$g_m \alpha 1/R \alpha (\beta * I_{VCO})/N \alpha (\beta * N * f_{ref})/N \quad (7)$$

Substituting (2), (3), (4), and (7) in equation (1), we get
BW $\alpha$ K
As K is made proportional to $f_{ref}$,
BW $\alpha$ $f_{ref}$
Thus, the bandwidth of the PLL 100 is made independent of PVT variations and loop division, and is directly proportional to the frequency of the input reference signal $f_{ref}$.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A phase-locked loop (PLL), comprising:
a voltage-controlled oscillator (VCO), including:
a voltage-to-current converter for converting a control voltage to a first current; and
a current-controlled oscillator, connected to the voltage-to-current converter, for generating an oscillator signal based on the first current;
a phase detector, connected to the VCO, for generating an error signal based on an input reference signal and a fraction of the oscillator signal;
a current mirror circuit, connected to the voltage-to-current converter, for generating a second current based on a fraction of the first current;
a dual charge pump circuit connected between the phase detector and the voltage-to-current converter, for receiving the error signal and the second current, and generating first and second charge pump currents according to a predetermined ratio; and
an active loop filter connected to the dual charge pump circuit, the current mirror circuit and the voltage-to-current converter, wherein the active loop filter generates the control voltage based on the first and second charge pump currents, and wherein the active loop filter includes:
an input capacitance that varies with variation in the predetermined ratio of the first and second charge pump currents; and
a transconductance stage having a transconductance that varies based on a third current generated by the current mirror circuit, wherein the transconductance stage includes one or more input transistors that operate in a sub-threshold region.

2. The PLL of claim 1, wherein the predetermined ratio is directly proportional to the frequency of the input reference signal.

3. The PLL of claim 1, further comprising a current programming circuit for varying the predetermined ratio between the first and second charge pump currents.

4. The PLL of claim 3, wherein the current programming circuit is integrated in the current mirror circuit.

5. The PLL of claim 3, wherein the current programming circuit is integrated in the dual charge pump circuit.

6. The PLL of claim 1, further comprising a frequency divider, connected between the current-controlled oscillator and the phase detector, for providing the fraction of the oscillator signal to the phase detector.

7. The PLL of claim 1, further comprising a current divider circuit, connected between the current mirror circuit and the active loop filter, for providing the third current to the transconductance stage.

8. The PLL of claim 1, wherein the active loop filter is an active low pass filter.

9. A system for generating an oscillator signal, the system comprising:
a voltage-to-current converter for converting a control voltage to a first current;
a current-controlled oscillator connected to the voltage-to-current converter for generating the oscillator signal based on the first current;
a phase detector, connected to the current-controlled oscillator, for generating an error signal based on an input reference signal and a fraction of the oscillator signal;
a current mirror circuit, connected to the voltage-to-current converter, that generates a second current based on a fraction of the first current;
a dual charge pump circuit connected between the phase detector and the voltage-to-current converter, for receiving the error signal and the second current, and generating first and second charge pump currents according to a predetermined ratio; and
an active loop filter connected to the dual charge pump circuit, the current mirror circuit and the voltage-to-current converter, wherein the active loop filter generates the control voltage based on the first and second charge pump currents, and wherein the active loop filter includes:

an input capacitance that varies with variation in the predetermined ratio of the first and second charge pump currents; and a transconductance stage having a transconductance that varies based on a third current generated by the current mirror circuit, wherein the transconductance stage includes one or more input transistors that operate in a sub-threshold region.

10. The system for generating an oscillator signal of claim 9, wherein the predetermined ratio is directly proportional to the frequency of the input reference signal.

11. The system for generating an oscillator signal of claim 9, further comprising a current programming circuit for varying the predetermined ratio between the first and second charge pump currents.

12. The system for generating an oscillator signal of claim 11, wherein the current programming circuit is integrated in the current mirror circuit.

13. The system for generating an oscillator signal claim 11, wherein the current programming circuit is integrated in the dual charge pump circuit.

14. The system for generating an oscillator signal of claim 9, further comprising a frequency divider connected between the current-controlled oscillator and the phase detector for providing the fraction of the oscillator signal to the phase detector.

15. The system for generating an oscillator signal of claim 9, further comprising a current divider circuit connected between the current mirror circuit and the transconductance stage for providing the fraction of the third current to the active loop filter.

16. The system for generating an oscillator signal of claim 9, wherein the active loop filter is an active low pass filter.

\* \* \* \* \*